United States Patent
McGowan et al.

(10) Patent No.: US 9,240,813 B2
(45) Date of Patent: Jan. 19, 2016

(54) DISTRIBUTED DIGITALLY CONVERTIBLE RADIO (DDCR)

(71) Applicant: Telefonaktiebolaget L M Ericsson (publ), Stockholm (SE)

(72) Inventors: Neil McGowan, Stittsville (CA); Marthinus Willem Da Silveira, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 141 days.

(21) Appl. No.: 13/705,704

(22) Filed: Dec. 5, 2012

(65) Prior Publication Data
US 2014/0153666 A1  Jun. 5, 2014

(51) Int. Cl.
*H04W 88/08* (2009.01)
*H04B 1/04* (2006.01)
*H04B 1/38* (2015.01)
*H04B 1/18* (2006.01)

(52) U.S. Cl.
CPC .............. *H04B 1/0483* (2013.01); *H04B 1/38* (2013.01); *H04B 1/0458* (2013.01); *H04B 1/18* (2013.01); *H04B 2001/0433* (2013.01)

(58) Field of Classification Search
CPC ...... H04B 1/0458; H04B 1/0483; H04B 1/18; H04B 2001/0433; H04B 1/38; H04L 27/06
USPC ........ 375/296; 455/561, 562.1; 342/372, 814, 342/816, 853
See application file for complete search history.

(56) References Cited

U.S. PATENT DOCUMENTS

| | | | | | |
|---|---|---|---|---|---|
| 5,559,791 | A | * | 9/1996 | Bremer et al. | ................. 370/207 |
| 5,805,575 | A | * | 9/1998 | Kamin, Jr. | ............... H01Q 3/22 370/331 |
| 5,825,762 | A | * | 10/1998 | Kamin, Jr. | ............... H01Q 3/22 342/373 |
| 5,834,972 | A | * | 11/1998 | Schiemenz, Jr. | ........ H03F 3/602 330/124 D |

(Continued)

FOREIGN PATENT DOCUMENTS

CN 202168076 U  3/2012
EP 0704964 A2  4/1996

(Continued)

OTHER PUBLICATIONS

Invitation to Pay Additional Fees and Partial Search for PCT/IB2013/060605, mailed Apr. 14, 2014, 5 pages.

(Continued)

*Primary Examiner* — Sophia Vlahos
(74) *Attorney, Agent, or Firm* — Withrow & Terranova, PLLC

(57) ABSTRACT

Embodiments of a hybrid unit that supports a configurable number of radio units for a base station in a cellular communications network and embodiments of Distributed Digitally Convertible Radio Units (DDCRUs) for use with the hybrid unit are disclosed. In one embodiment, a hybrid unit for a base station in a cellular communications network is provided. The hybrid unit includes an analog hybrid matrix. The analog hybrid matrix includes a number of feeder ports operative to connect to at least one radio unit and up to a number of radio units that are external to and separate from the hybrid unit. In one preferred embodiment, the radio unit(s) is(are) DDCRU (s). The analog hybrid matrix also includes a number of antenna ports operative to connect to at least one and up to a corresponding number of antennas of the base station.

22 Claims, 9 Drawing Sheets

(56) References Cited

U.S. PATENT DOCUMENTS

| | | | | |
|---|---|---|---|---|
| 5,854,611 | A | * | 12/1998 | Gans et al. .................. 342/373 |
| 5,854,986 | A | * | 12/1998 | Dorren et al. .............. 455/562.1 |
| 5,913,177 | A | * | 6/1999 | Meredith .............. H04W 16/28 455/272 |
| 6,006,111 | A | * | 12/1999 | Rowland ................ H03F 3/602 330/124 R |
| 6,006,113 | A | * | 12/1999 | Meredith ................ H04B 7/04 455/102 |
| 6,052,605 | A | * | 4/2000 | Meredith ............ H04W 72/082 455/560 |
| 6,728,554 | B1 | * | 4/2004 | Wegner ................ H01Q 1/246 342/373 |
| 7,206,355 | B2 | | 4/2007 | McGowan et al. |
| 7,245,938 | B2 | * | 7/2007 | Sobczak ................ H01Q 1/246 342/373 |
| 7,248,656 | B2 | * | 7/2007 | da Silveira ............ H03F 1/3241 375/346 |
| 7,746,966 | B2 | | 6/2010 | Lee et al. |
| 7,904,027 | B2 | * | 3/2011 | Onoda .................... H04B 1/52 455/306 |
| 7,962,145 | B2 | * | 6/2011 | Gale et al. .................... 455/450 |
| 8,090,326 | B1 | * | 1/2012 | Wu ...................... H04B 1/0057 455/553.1 |
| 8,201,050 | B2 | | 6/2012 | Choi et al. |
| 8,204,544 | B2 | * | 6/2012 | Beaudin ................ H04B 1/401 455/561 |
| 8,213,880 | B2 | * | 7/2012 | van Zelm .............. H03F 1/3247 375/296 |
| 8,275,081 | B2 | | 9/2012 | Jiang et al. |
| 8,362,955 | B2 | * | 1/2013 | Adams et al. .......... H01Q 1/246 342/368 |
| 8,504,109 | B2 | * | 8/2013 | McGowan ............. H01Q 1/246 370/320 |
| 8,588,334 | B2 | * | 11/2013 | McGowan ............. H01Q 1/246 330/84 |
| 2004/0105509 | A1 | * | 6/2004 | McGowan et al. ... H03F 1/3241 375/296 |
| 2004/0209572 | A1 | | 10/2004 | Thomas |
| 2006/0221905 | A1 | * | 10/2006 | Behzad et al. ................ 370/335 |
| 2008/0287163 | A1 | | 11/2008 | Skarby et al. |
| 2013/0022152 | A1 | | 1/2013 | McGowan et al. |
| 2013/0225222 | A1 | | 8/2013 | Ma et al. |

FOREIGN PATENT DOCUMENTS

| | | |
|---|---|---|
| EP | 0725498 A1 | 8/1996 |
| WO | 9506369 A1 | 3/1995 |
| WO | 2013014574 A1 | 1/2013 |

OTHER PUBLICATIONS

International Search Report and Written Opinion for PCT/IB2014/061124, mailed Dec. 8, 2014, 12 pages.

International Search Report and Written Opinion for PCT/IB2013/060605, mailed Jul. 7, 2014, 15 pages.

International Preliminary Report on Patentability for International Patent Application No. PCT/IB2013/060605, mailed Jun. 18, 2015, 11 pages.

* cited by examiner

US 9,240,813 B2

DISTRIBUTED DIGITALLY CONVERTIBLE RADIO (DDCR)

FIELD OF THE DISCLOSURE

The present disclosure relates to base station in a cellular communications network.

BACKGROUND

In a cellular communications network, some or all of the cells may each be divided into two or more sectors. For instance, FIG. 1 illustrates a cell 10 of cellular communications network that is divided into three sectors 12-1, 12-2, and 12-3, which are generally referred to herein as sectors 12. Conventionally, a base station, or Base Station Transceiver Set (BTS), is located at the center of the cell 10 and includes a separate amplifier and antenna for each of the sectors 12. The antennas are so called sector antennas that radiate corresponding beams 14-1 through 14-3 that fill the corresponding sectors 12 without overlapping into adjacent sectors 12. For the conventional base station, there is no power sharing between the power amplifiers for the sectors 12 and, as such, the amplifier for each of the sectors 12 must be designed to satisfy maximum power level demands for the sector 12. In addition, if one of the power amplifiers or the corresponding transmitter fails, the downlink in the corresponding sector 12 is totally lost.

U.S. Pat. No. 7,206,355 entitled DIGITALLY CONVERTIBLE RADIO and U.S. Pat. No. 7,248,656 entitled DIGITAL CONVERTIBLE RADIO SNR OPTIMIZATION each disclose embodiments of a Digitally Convertible Radio (DCR). In one embodiment, the DCR includes multiple parallel power amplifiers and enables power sharing between the power amplifiers such that any one of the power amplifiers is not required to be designed to satisfy maximum sector power level demands. More specifically, FIG. 2 illustrates one embodiment of a DCR 16 according to the teachings of U.S. Pat. No. 7,206,355 and U.S. Pat. No. 7,248,656. As illustrated, the DCR 16 includes a Digital Hybrid Matrix (DHM) 18, an upconversion module 20, a power amplifier module 22 including power amplifiers 24-1 through 24-3, an Analog Hybrid Matrix (AHM) 26, and antennas 28-1 through 28-3 connected as shown. The DHM 18 receives a number of digital transmit signals ($S_1$ through $S_3$) each being for a different sector of a cell. The DHM 18 splits and combines the digital transmit signals ($S_1$ through $S_3$) to generate transformed transmit signals ($T_1$ through $T_3$). Each of the transformed transmit signals ($T_1$ through $T_3$) includes a component of each of the digital transmit signals ($S_1$ through $S_3$). More specifically, as disclosed in U.S. Pat. No. 7,248,656, a first set of complex weights are applied to the digital transmit signals ($S_1$ through $S_3$) and the resulting complex weighted digital transmit signals are combined, or summed, to provide the first transformed transmit signal ($T_1$). Likewise, a second set of complex weights are applied to the digital transmit signals ($S_1$ through $S_3$) and the resulting complex weighted digital transmit signals are combined, or summed, to provide the second transformed transmit signal ($T_2$), and a third set of complex weights are applied to the digital transmit signals ($S_1$ through $S_3$) and the resulting complex weighted digital transmit signals are combined, or summed, to provide the third transformed transmit signal ($T_3$).

The transformed transmit signals ($T_1$ through $T_3$) are upconverted to a desired radio frequency by the upconversion module 20 to thereby provide upconverted transformed transmit signals ($T_{1,UP}$ through $T_{3,UP}$). The power amplifiers 24-1 through 24-3 in the power amplifier module 22 then amplify the upconverted transformed transmit signals ($T_{1,UP}$ through $T_{3,UP}$) to provide radio frequency transformed transmit signals ($T_{1,RF}$ through $T_{3,RF}$). The AHM 26 then splits and combines the radio frequency transformed transmit signals ($T_{1,RF}$ through $T_{3,RF}$) to thereby generate radio frequency transmit signals ($A_1$ through $A_3$). Notably, the weight sets in the DHM 18 are configured such that the first radio frequency transmit signal ($A_1$) output by the AHM 26 represents the first digital transmit signal ($S_1$) and components representing the second and third digital transmit signals ($S_2$ and $S_3$) in the first radio frequency transmit signal ($A_1$) are minimized and preferably eliminated. In addition, the weight sets in the DHM 18 are configured such that the second radio frequency transmit signal ($A_2$) output by the AHM 26 represents the second digital transmit signal ($S_2$) and components representing the first and third digital transmit signals ($S_1$ and $S_3$) in the second radio frequency transmit signal ($A_2$) are minimized and preferably eliminated and such that the third radio frequency transmit signal ($A_3$) output by the AHM 26 represents the third digital transmit signal ($S_3$) and components representing the first and second digital transmit signals ($S_1$ and $S_2$) in the third radio frequency transmit signal ($A_3$) are minimized and preferably eliminated.

In order to configure the complex weights of the DHM 18, the DCR 16 includes a feedback path including a downconversion module 30, a correlator module 32, and an adaptor 34. The operation of the downconversion module 30, the correlator module 32, and the adaptor 34 and the algorithm for computing the complex weights for the DHM 18 are described in U.S. Pat. No. 7,248,656. In general, as discussed above, the complex weights are configured such that the radio frequency transmit signals ($A_1$ through $A_3$) are output by the AHM 26.

An important benefit of the DCR 16 is that, by using the DHM 18 and the AHM 26, coherent power sharing between the power amplifiers 24-1 through 24-3 is provided. As a result, any one of the power amplifiers 24-1 through 24-3 is not required to be designed to satisfy maximum sector power level demands. In addition, if any one of the power amplifiers 24-1 through 24-3 fails, the DCR 16 is enabled to provide operation in all three sectors, but in a somewhat degraded mode of operation.

One issue with the DCR disclosed in U.S. Pat. No. 7,206,355 and U.S. Pat. No. 7,248,656 is that the DCR must include all resources needed to satisfy future maximum capacity requirements for the cell. Thus, an operator is required to incur significant expense at initial deployment even though initial capacity requirements may be low. As such, there is a need for an improved DCR that addresses this issue.

SUMMARY

Embodiments of a hybrid unit that supports a configurable number of radio units for a base station in a cellular communications network are disclosed. In one embodiment, a hybrid unit for a base station in a cellular communications network is provided. The hybrid unit includes an analog hybrid matrix. The analog hybrid matrix includes a number of feeder ports operative to connect to at least one radio unit and up to a maximum number of radio units that are external to and separate from the hybrid unit. In one preferred embodiment, the radio unit(s) is(are) Distributed Digital Convertible Radio Unit(s) (DDCRU(s)). In one particular embodiment, a total number of transmitters in the number of radio units is equal to the number of feeder ports of the analog hybrid matrix. The analog hybrid matrix also includes a number of antenna ports operative to connect to at least one and up to a corresponding number of antennas of the base station. The number of radio units connected to the feeder ports of the analog hybrid matrix is reconfigurable. Further, in one preferred embodiment, no active reconfiguration of the hybrid unit is required in response to reconfiguring the number of radio units connected to the feeder ports of the analog hybrid matrix.

In one embodiment, only one of the feeder ports of the analog hybrid matrix is connected to a radio unit via a corresponding feeder cable. In one embodiment, the analog hybrid matrix is operative to receive an amplified radio frequency transmit signal from the radio unit at the feeder port and split the amplified radio frequency transmit signal to thereby generate an amplified radio frequency transmit signal at each of the antenna ports. In one embodiment, the analog hybrid matrix is additionally or alternatively operative to receive radio frequency receive signals at the antenna ports from corresponding tower mounted amplifiers, where each of the radio frequency receive signals is at a different carrier frequency due to different frequency shifts applied by the tower mounted amplifiers. The analog hybrid matrix then generates transformed radio frequency receive signals at the feeder ports such that one of the transformed radio frequency receive signals is output to the radio unit via the one feeder port. Each of the transformed radio frequency receive signals includes a component for each of the radio frequency receive signals.

In another embodiment, the feeder ports of the analog hybrid matrix are connected to multiple radio units such that each of the feeder ports is connected to a different transceiver of the multiple radio units. In one embodiment, the analog hybrid matrix is operative to receive multiple radio frequency transformed transmit signals from the transceivers of the radio units at the corresponding feeder ports. Each of the radio frequency transformed transmit signals includes a component of each of multiple radio frequency transmit signals to be transmitted via antennas connected to the antenna ports of the analog hybrid matrix. The analog hybrid matrix splits and combines the radio frequency transformed transmit signals to thereby generate the radio frequency transmit signals at the antenna ports. In one embodiment, the hybrid unit is additionally or alternatively operative to receive multiple radio frequency receive signals at the antenna ports. The analog hybrid matrix generates transformed radio frequency receive signals at the feeder ports such that a different one of the transformed radio frequency receive signals is output to each of the transceivers of the radio units via a corresponding one of the feeder ports. Each of the transformed radio frequency receive signals includes a component for each of the radio frequency receive signals.

Embodiments of a DDCRU are also disclosed. In one embodiment, a DDCRU for a base station includes a feeder port, a Distributed Digital Hybrid Matrix (DDHM) component, and a transmitter. The feeder port is operative to couple the DDCRU to a hybrid unit that is external to and separate from the DDCRU via a feeder cable. The DDHM component is operative to transform multiple digital transmit signals into a transformed transmit signal that includes a component for each of the digital transmit signals. The transmitter upconverts and amplifies the transformed transmit signal to provide a radio frequency transformed transmit signal to be output to the hybrid unit via the feeder port. In one embodiment, the DDHM component of the DDCRU and one or more additional DDHM components of one or more additional DDCRUs for the base station connected to the hybrid unit form a DDHM that converts the multiple digital transmit signals into multiple transformed transmit signals each including a component for each of the digital transmit signals.

In one embodiment, the DDCRU and the one or more additional DDCRUs are phase-locked. In one embodiment, the DDCRU adaptively configures the DDHM components of the DDCRU and the one or more additional DDCRUs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
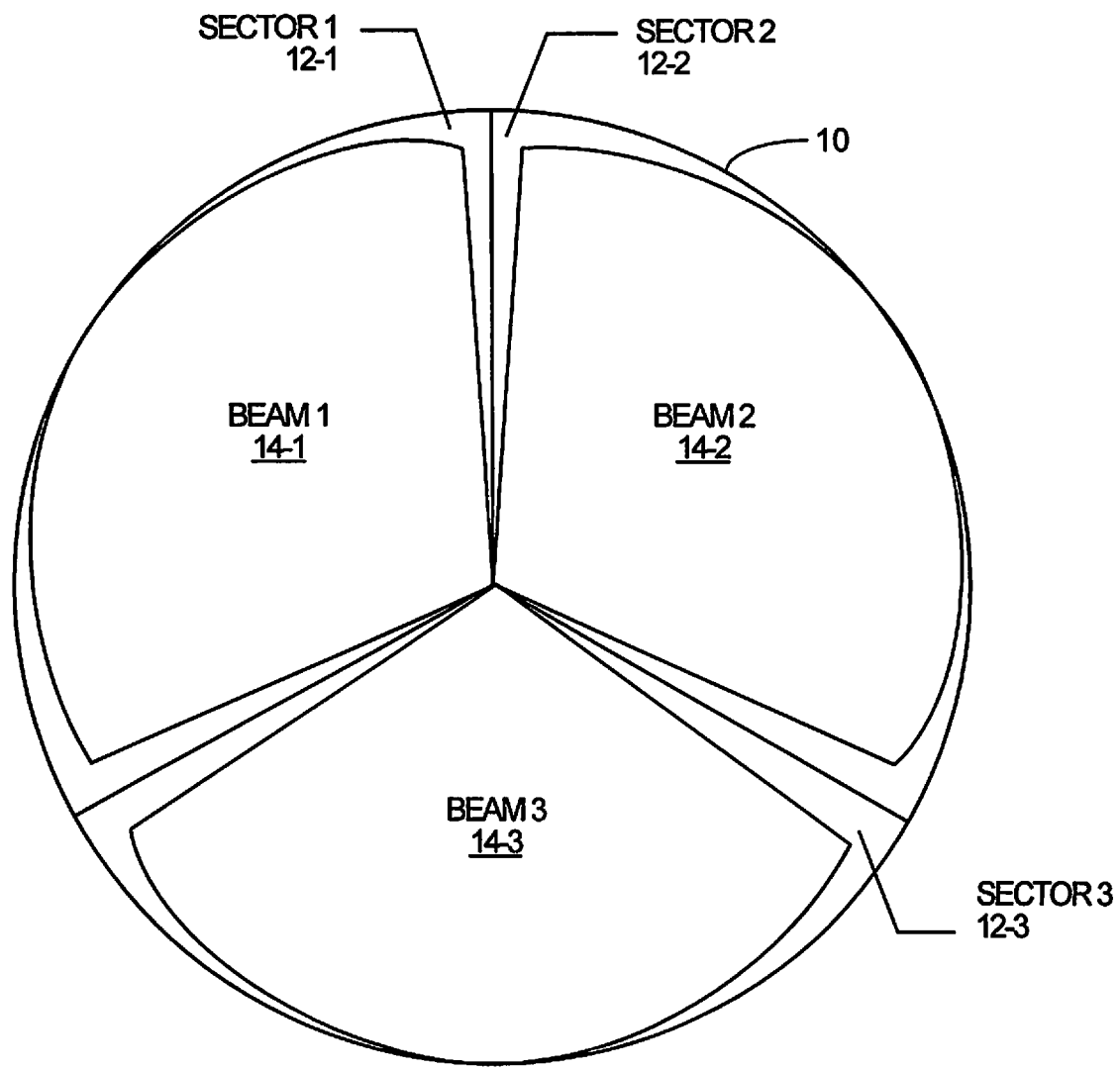
FIG. 1 illustrates a cell having multiple sectors.
Figure 2:
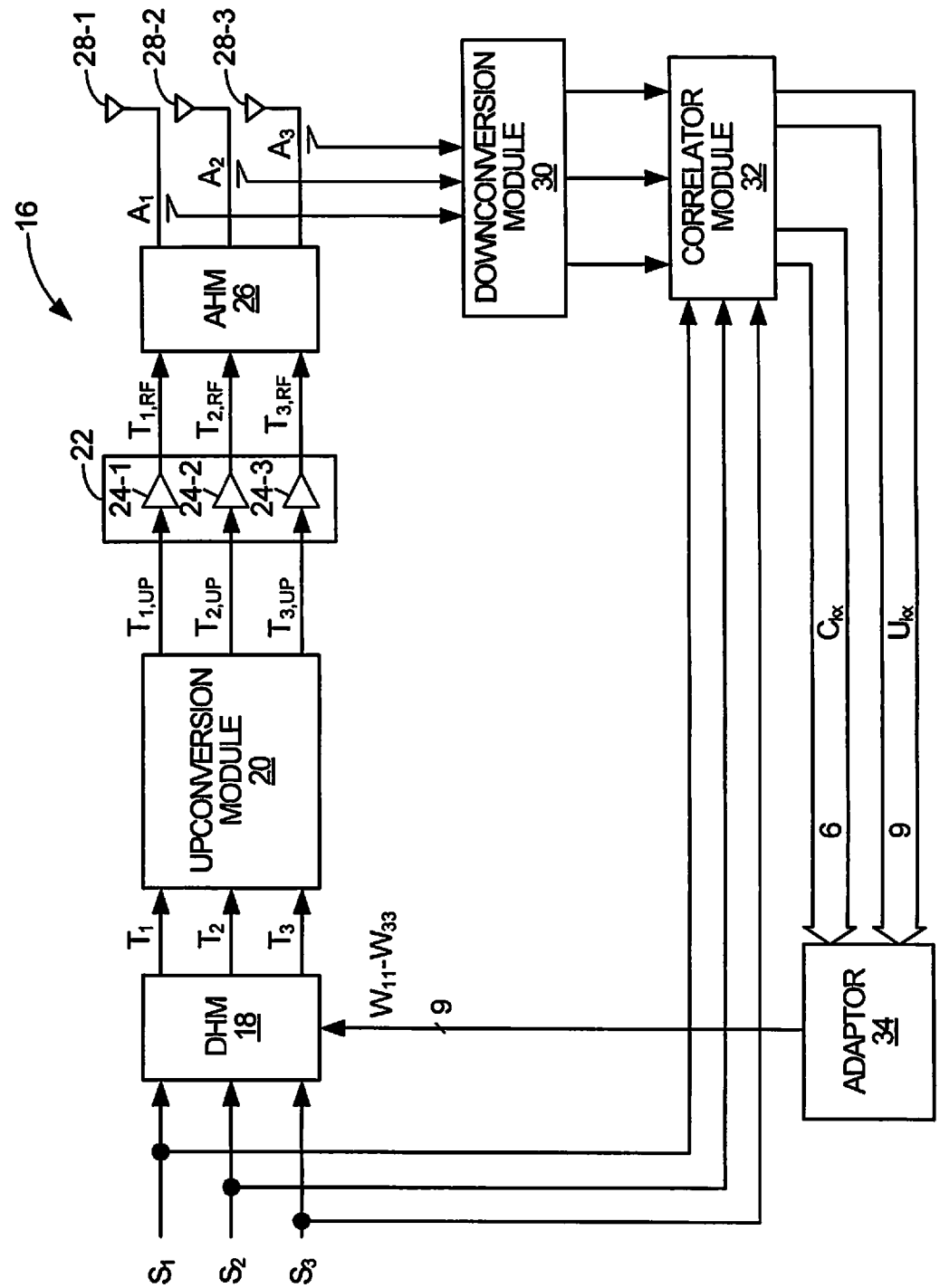
FIG. 2 illustrates a Digital Convertible Radio (DCR) for a base station serving a cell in a cellular communications network.
Figure 3:
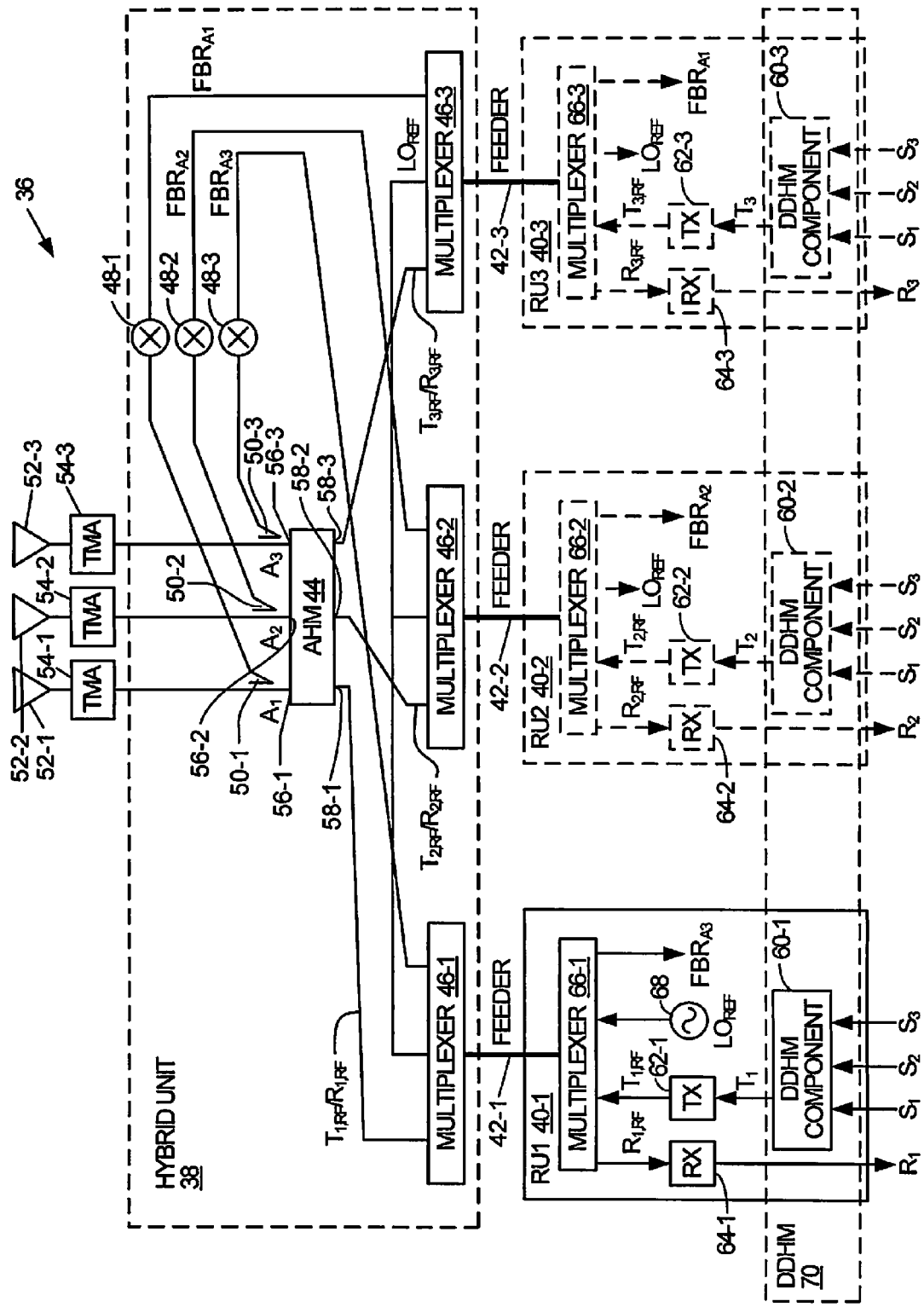
FIG. 3 illustrates a hybrid unit and a reconfigurable number of Distributed Digital Convertible Radio Units (DDCRUs) for a base station in a cellular communications network according to one embodiment of the present disclosure.

Embodiments of a hybrid unit that supports a configurable number of radio units for a base station in a cellular communications network are disclosed. In addition, embodiments of a Distributed Digitally Convertible Radio (DDCR) are also disclosed. In this regard, FIG. 3 illustrates a base station 36 that includes a hybrid unit 38 connected to a reconfigurable number of radio units 40-1 through 40-3 according to one embodiment of the present disclosure. The radio units 40-1 through 40-3 may more generally be referred to herein collectively as radio units 40 and individually as radio unit 40. As discussed below in detail, in this embodiment, the radio units 40 are DDCRUs. The hybrid unit 38 is connected to at least one and up to all three of the radio units 40 via feeder cables 42-1 through 42-3, which are generally referred to herein collectively as feeder cables 42 and individually as feeder cable 42. Note that while the hybrid unit 38 is connected to at least one and up to three radio units 40 in this embodiment, the hybrid unit 38 may be designed to support up to any desired number of radio units 40 (e.g., 4, 8, 16, etc.). In this embodiment, the hybrid unit 38 is connected to at least the radio unit 40-1 but may additionally be connected to the radio units 40-2 and 40-3 if desired as indicated by the dashed lines illustrating the radio units 40-2 and 40-3. For example, at the time of initial deployment of the base station 36, the operator may connect only one radio unit (e.g., the radio unit 40-1) to the hybrid unit 38. As capacity needs increase, the operator may then connect additional radio units (e.g., the radio units 40-2 and 40-3) to obtain additional capacity.

The hybrid unit 38 is external to and separate from the radio units 40. The hybrid unit 38 includes an Analog Hybrid Matrix (AHM) 44, which in this example is a 3×3 AHM. In addition, in this embodiment, the hybrid unit 38 includes multiplexers 46-1 through 46-3 (generally referred to herein collectively as multiplexers 46 and individually as multiplexer 46), mixers 48-1 through 48-3 (generally referred to herein collectively as mixers 48 or individually as mixer 48), and couplers 50-1 through 50-3 (generally referred to herein collectively as couplers 50 and individually as coupler 50) connected to one another and the AHM 44 as shown. In this embodiment, the base station 36 serves a three-sector cell and includes three antennas 52-1 through 52-3 (generally referred to herein collectively as antennas 52 and individually as antenna 52), one for each sector. In addition, the base station 36 includes Tower Mounted Amplifier units (TMAs) 54-1 through 54-3 (generally referred to herein collectively as TMAs 54 and individually as TMA 54) as shown.

The AHM 44 includes three antenna ports 56-1 through 56-3 (generally referred to herein collectively as antenna ports 56 and individually as antenna port 56) connected to the antennas 52-1 through 52-3 via the TMAs 54-1 through 54-3, respectively. Note, however, that the TMAs 54 are optional and, as such, may not be included in some embodiments or implementations of the base station 36. The AHM 44 also includes three feeder ports 58-1 through 58-3 (generally referred to herein collectively as feeder ports 58 and individually as feeder port 58) that enable the AHM 44 to connect to one or more of the radio units 40-1 through 40-3 via the feeder cables 42-1 through 42-3, respectively. Note that while in this example the AHM 44 is a 3×3 AHM having three antenna ports 56 and three feeder ports 58, the AHM 44 is not limited thereto. The AHM 44 is more generally an N×N AHM, where N is greater than or equal to 2, such that the hybrid unit 38 can support multiple radio units 40 having any number, up to N, of transceivers and any number, up to N, of antennas 52.

The radio unit 40-1 includes a Distributed Digital Hybrid Matrix (DDHM) component 60-1, a transmitter 62-1 and a receiver 64-1 that together form a transceiver, a multiplexer 66-1, and a local oscillator 68 connected as shown. A feeder port of the radio unit 40-1 connects the output of the multiplexer 66-1 to the feeder cable 42-1. The radio unit 40-2 includes a DDHM component 60-2, a transmitter 62-2, and a receiver 64-2 connected as shown. A feeder port of the radio unit 40-2 connects the output of a multiplexer 66-2 to the feeder cable 42-2. Likewise, the radio unit 40-3 includes a DDHM component 60-3, a transmitter 62-3, and a receiver 64-3 connected as shown. A feeder port of the radio unit 40-3 connects the output of a multiplexer 66-3 to the feeder cable 42-3. Notably, while each of the radio units 40 in this embodiment includes only one transmitter 62, the present disclosure is not limited thereto. Each of the radio units 40 may include any number of one or more transmitters 62. Note, however, that if any of the radio units 40 includes multiple transmitters 62, then a separate feeder cable 42 and therefore a separate feeder port 58 of the AHM 44 is used for each transmitter 62. The multiplexers 66 of the radio units 40 and the multiplexers 46 of the hybrid unit 38 operate to multiplex transformed radio frequency receive signals from the hybrid unit 38, radio frequency transformed transmit signals from the transmitters 62, a reference local oscillator signal ($LO_{REF}$) from the local oscillator 68, and feedback signals ($FBR_{A1}$ through $FBR_{A3}$) from the hybrid unit 38 onto the corresponding feeder cables 42.

Together, the DDHM components 60 of the radio units 40 form a DDHM 70. In this particular embodiment the DDHM 70 is a 3×3 DHM that is distributed across the radio units 40. Note, however, that the DDHM 70 is not limited to 3×3 DDHM and can more generally be an N×N DDHM in order to support any number, N, of digital transmit signals and any number of antennas 52. In general, the DDHM components 60 are configured such that the DDHM 70 is effectively an inverse of the AHM 44. In addition, the DDHM components 60 are preferably further configured to compensate for any downstream errors between the DDHM components 60 and the AHM 44. Note that the reference local oscillator signal ($LO_{REF}$) enables the radio units 40 to be phase-locked, which is needed for proper operation of the radio units 40.

Figure 4:
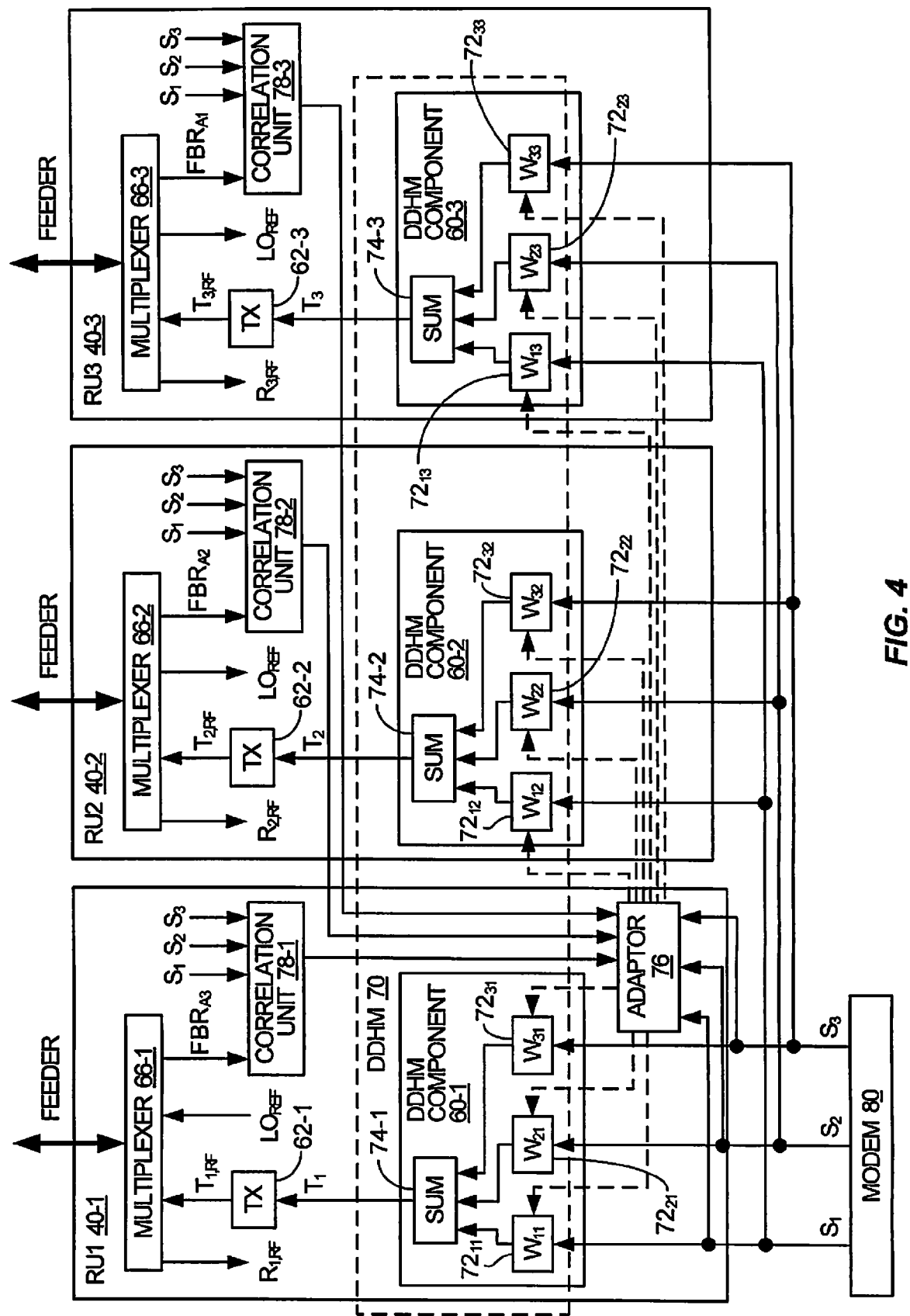
FIG. 4 is a more detailed illustration of the DDCRUs of FIG. 3 according to one embodiment of the present disclosure.

FIG. 4 illustrates the radio units 40 and, in particular, the DDHM components 60 in more detail according to one embodiment of the present disclosure. As illustrated, the DDHM component 60-1 includes complex weighting functions $72_{11}$, $72_{21}$, and $72_{31}$ that apply complex weights $W_{11}$, $W_{21}$, and $W_{31}$ to the digital transmit signals $S_1$ through $S_3$, respectively. In the most general case, each weight is an array of values optimized as a function of frequency. The resulting weighted digital transmit signals are combined by a sum function 74-1 to thereby provide the transformed transmit signal $T_1$. Likewise, the DDHM component 60-2 includes complex weighting functions $72_{12}$, $72_{22}$, and $72_{32}$ that apply complex weights $W_{12}$, $W_{22}$, and $W_{32}$ to the digital transmit signals $S_1$ through $S_3$, respectively. The resulting weighted digital transmit signals are combined by a sum function 74-2 to thereby provide the transformed transmit signal $T_2$. In the same manner, the DDHM component 60-3 includes complex weighting functions $72_{13}$, $72_{23}$, and $72_{33}$ that apply complex weights $W_{13}$, $W_{23}$, and $W_{33}$ to the digital transmit signals $S_1$ through $S_3$, respectively. The resulting weighted digital transmit signals are combined by a sum function 74-3 to thereby provide the transformed transmit signal $T_3$.

The complex weights $W_{11}$, $W_{21}$, and $W_{31}$ of the DDHM component 60-1, the complex weights $W_{12}$, $W_{22}$, and $W_{32}$ of the DDHM component 60-2, and the complex weights $W_{13}$, $W_{23}$, and $W_{33}$ of the DDHM component 60-3 are adaptively configured by an adaptor 76 in the radio unit 40-1 based on outputs of correlation units 78-1 through 78-3. Note that the adaptor 76 may alternatively be located in one of the other radio units 40-2 or 40-3. Similarly, a single correlation unit in one of the radio units 40-1 through 40-3 may replace the correlation units 78-1 through 78-3. In one preferred embodiment, the adaptor 76 and the correlation units 78-1 through 78-3 operate to configure the complex weights $W_{11}$, $W_{21}$, $W_{31}$, $W_{12}$, $W_{22}$, $W_{32}$, $W_{13}$, $W_{23}$, and $W_{33}$ using the algorithm described in U.S. Pat. No. 7,248,656, which is hereby incorporated herein by reference in its entirety. The complex weights $W_{11}$, $W_{21}$, $W_{31}$, $W_{12}$, $W_{22}$, $W_{32}$, $W_{13}$, $W_{23}$, and $W_{33}$ are configured by the adaptor 76 such that the components of the digital transmit signals $S_2$ and $S_3$ represented in the transformed transmit signals ($T_1$ through $T_3$) are minimized in the radio frequency transmit signal $A_1$ generated at the antenna port 56-1 of the AHM 44, the components of the digital transmit signals $S_1$ and $S_3$ represented in the transformed transmit signals ($T_1$ through $T_3$) are minimized in the radio frequency transmit signal $A_2$ generated at the antenna port 56-2 of the AHM 44, and the components of the digital transmit signals $S_1$ and $S_2$ represented in the transformed transmit signals ($T_1$ through $T_3$) are minimized in the radio frequency transmit signal $A_3$ generated at the antenna port 56-3 of the AHM 44. This is true regardless whether one, two, or three of the radio units 40 are connected to the hybrid unit 38 or whether the transmitter 62 of any of the radio units 40 has failed.

The manner in which the adaptor 76 passes the complex weights $W_{12}$, $W_{22}$, $W_{32}$, $W_{13}$, $W_{23}$, and $W_{33}$ to the radio units 40-2 and 40-3 can vary depending on the particular implementation. In general, any suitable technique or interface may be used. For example, the adaptor 76 may pass the complex weights using a direct interface between the radio units 40. As another example, the adaptor 76 may pass the complex weights via a modem 80 (also known as a baseband unit) that also generates and sends the digital transmit signals ($S_1$ through $S_3$) to the radio units 40.

Figure 5:
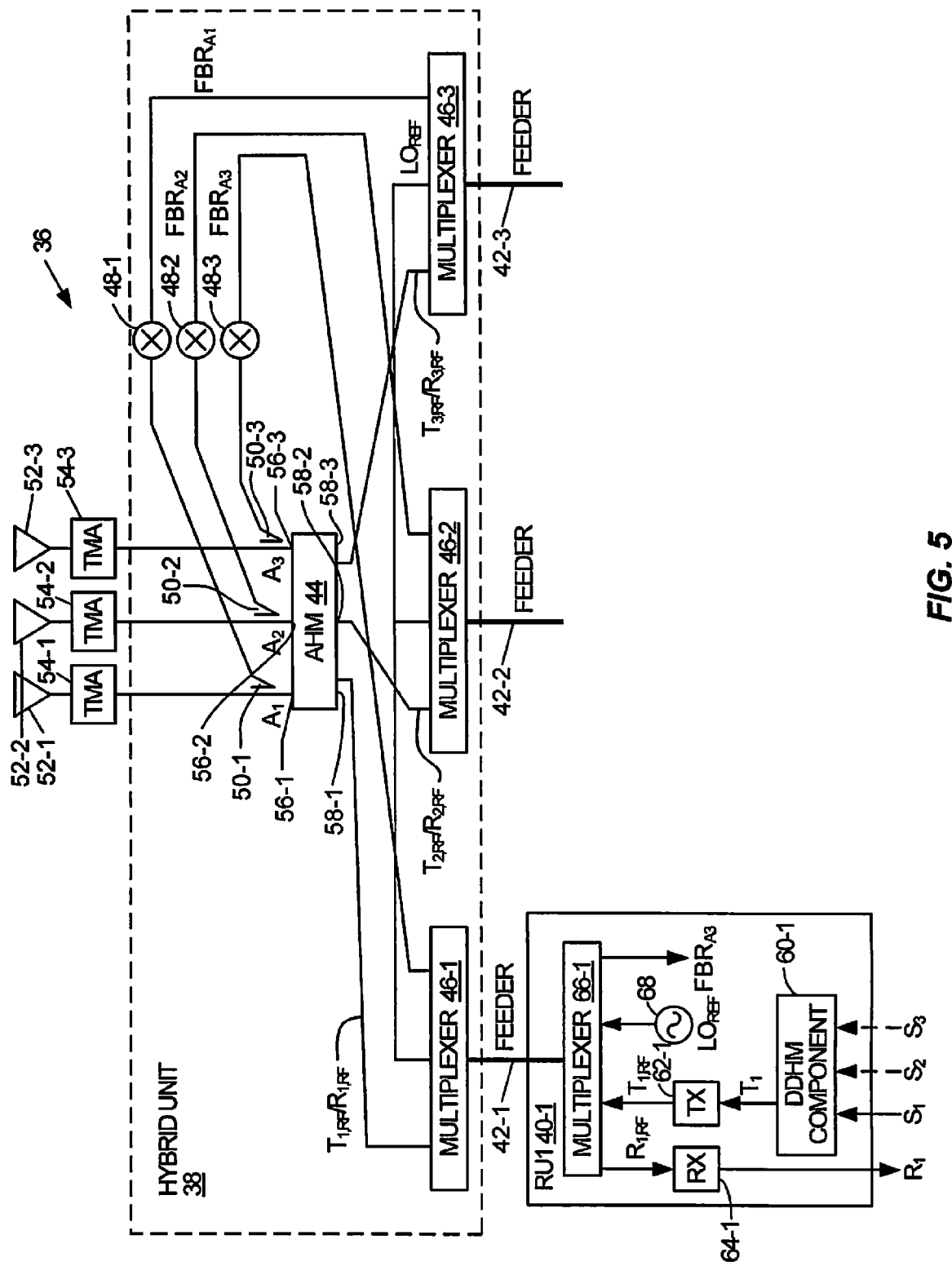
FIG. 5 illustrates the hybrid unit of FIG. 3 wherein only one of the DDCRUs is connected to the hybrid unit according to one embodiment of the present disclosure.

FIG. 5 illustrates the base station 36 of FIG. 3 in which only one of the radio units 40, which in this example is the radio unit 40-1, is connected to the hybrid unit 38 according to one embodiment of the present disclosure. During operation, for the downlink from the base station 36, the DDHM component 60-1 receives only the digital transmit signal $S_1$ and generates the transformed transmit signal $T_1$. In this case, since the digital transmit signals $S_2$ and $S_3$ are not present, the transformed transmit signal $T_1$ is a complex weighted version of the digital transmit signal $S_1$. The transmitter 62-1 upconverts and amplifies the transformed transmit signal $T_1$ to thereby provide a radio frequency transformed transmit signal $T_{1,RF}$. The multiplexer 66-1 multiplexes the radio frequency transformed transmit signal $T_{1,RF}$ onto the feeder cable 42-1 along with a transformed radio frequency receive signal, the reference local oscillator signal ($LO_{REF}$), and the feedback signal $FBR_{A3}$.

At the hybrid unit 38, the radio frequency transformed transmit signal $T_{1,RF}$ is provided to the feeder port 58-1 via the multiplexer 46-1. However, since the radio units 40-2 and 40-3 are not connected, there is no input at the feeder ports 58-2 and 58-3. Since there are no inputs at the feeder ports 58-2 and 58-3, the AHM 44 operates to split the radio frequency transformed transmit signal $T_{1,RF}$ to thereby provide the radio frequency transmit signals $A_1$ through $A_3$) at each of the antenna ports 56-1 through 56-3. In this embodiment, the radio frequency transmit signals ($A_1$ through $A_3$) are the same radio frequency transmit signal but with different phase shifts according to the desired transform function of the AHM 44.

For the uplink to the base station 36, radio frequency receive signals are received at the antennas 52-1 through 52-3 and passed through the corresponding TMAs 54-1 through 54-3 to the antenna ports 56-1 through 56-3 of the AHM 44. In this embodiment, the TMAs 54-1 through 54-3 are configured to apply different frequency shifts to the radio frequency receive signals such that the radio frequency receive signals provided to the antenna ports 56-1 through 56-3 are each at a different carrier frequency. For example, the TMA 54-1 may apply a frequency shift of $-\Delta f$ relative to the center of the uplink carrier frequency f of the uplink channel and $\Delta f$ is relatively small relative to f, the TMA 54-2 may apply a frequency shift of 0, and the TMA 54-3 may apply a frequency shift of $\Delta f$ relative to the center of the uplink carrier frequency f. For more details regarding the frequency shifting applied by the TMAs 54-1 through 54-3, the interested reader is directed to U.S. Patent Application Publication No. 2008/0287163 entitled METHOD AND APPARATUS FOR CONVERTING BETWEEN A MULTI-SECTOR, OMNI-BASE STATION CONFIGURATION AND A MULTI-SECTOR BASE STATION CONFIGURATION, which was published on Nov. 20, 2008 and is hereby incorporated herein by reference for its teachings on the TMAs 54 and the frequency shifts applied by the TMAs 54.

The AHM 44 splits and combines the frequency-shifted radio frequency receive signals according to the desired transform function of the AHM 44 to thereby provide transformed radio frequency receive signals ($R_{1,RF}$ through $R_{3,RF}$) at the feeder ports 58-1 through 58-3, respectively. Notably, the AHM 44 provides the transformed radio frequency receive signals ($R_{1,RF}$ through $R_{3,RF}$) at the feeder ports 58-1 through 58-3 regardless of whether the radio units 40 are connected to the feeder ports 58. As a result, the AHM 44 does not need to be reconfigured when the radio units 40 are connected, disconnected, or fail.

In general, each of the transformed radio frequency receive signals ($R_{1,RF}$ through $R_{3,RF}$) includes a component for each of the frequency-shifted radio frequency receive signals. More specifically, in one particular embodiment, the AHM 44 has a transfer function in the uplink direction defined as:

$$R_{1,RF} = \frac{1}{\sqrt{3}}(R_{ANT1} + R_{ANT2}e^{j120°} + R_{ANT3}e^{j240°})$$

$$R_{2,RF} = \frac{1}{\sqrt{3}}(R_{ANT1} + R_{ANT2}e^{j0°} + R_{ANT3}e^{j0°})$$

$$R_{3,RF} = \frac{1}{\sqrt{3}}(R_{ANT1} + R_{ANT2}e^{-j120°} + R_{ANT3}e^{-j240°})$$

where $R_{ANT1}$ is the radio frequency receive signal received at the antenna port 56-1, $R_{ANT2}$ is the radio frequency receive signal received at the antenna port 56-2, and $R_{ANT3}$ is the radio frequency receive signal received at the antenna port 56-3. As such, the transformed radio frequency receive signal $R_{1,RF}$ has components of the frequency-shifted radio frequency receive signals at phases of 0, 120, and 240 degrees, respectively. In a similar manner, the transformed radio frequency receive signal $R_{2,RF}$ has components of the frequency-shifted radio frequency receive signals at phases of 0, 0, and 0 degrees, respectively; and the transformed radio frequency receive signal $R_{3,RF}$ has components of the frequency-shifted radio frequency receive signals at phases of 0, -120, and -240 degrees, respectively. Note that, as will be appreciated by one of ordinary skill in the art, the transform function of the AHM 44 will vary depending on its size. For example, a 4×4 AHM has a transform function that is different than that of the 3×3 AHM given above.

The multiplexer 46-1 multiplexes the transformed radio frequency receive signal $R_{1,RF}$ onto the feeder cable 42-1 along with the radio frequency transformed transmit signal $T_{1,RF}$, the reference local oscillator signal ($LO_{REF}$), and the feedback signal $FBR_{A3}$. At the radio unit 40-1, the multiplexer 66-1 provides the transformed radio frequency receive signal $R_{1,RF}$ to the receiver 64-1, which downconverts the transformed radio frequency receive signal $R_{1,RF}$ to baseband or a desired intermediate frequency to thereby provide a receive signal $R_1$. Due to the frequency shifts applied by the TMAs 54, the components for the radio frequency receive signals in the receive signal $R_1$ are located at different frequencies relative to the uplink center frequency. As such, the radio can provide a baseband representation of each of the radio frequency receive signals from the receive signal $R_1$. Note that the modem 80 (FIG. 4) can process the receive signal $R_1$ to obtain a separate baseband representation of each of the radio frequency receive signals.

Figure 6:
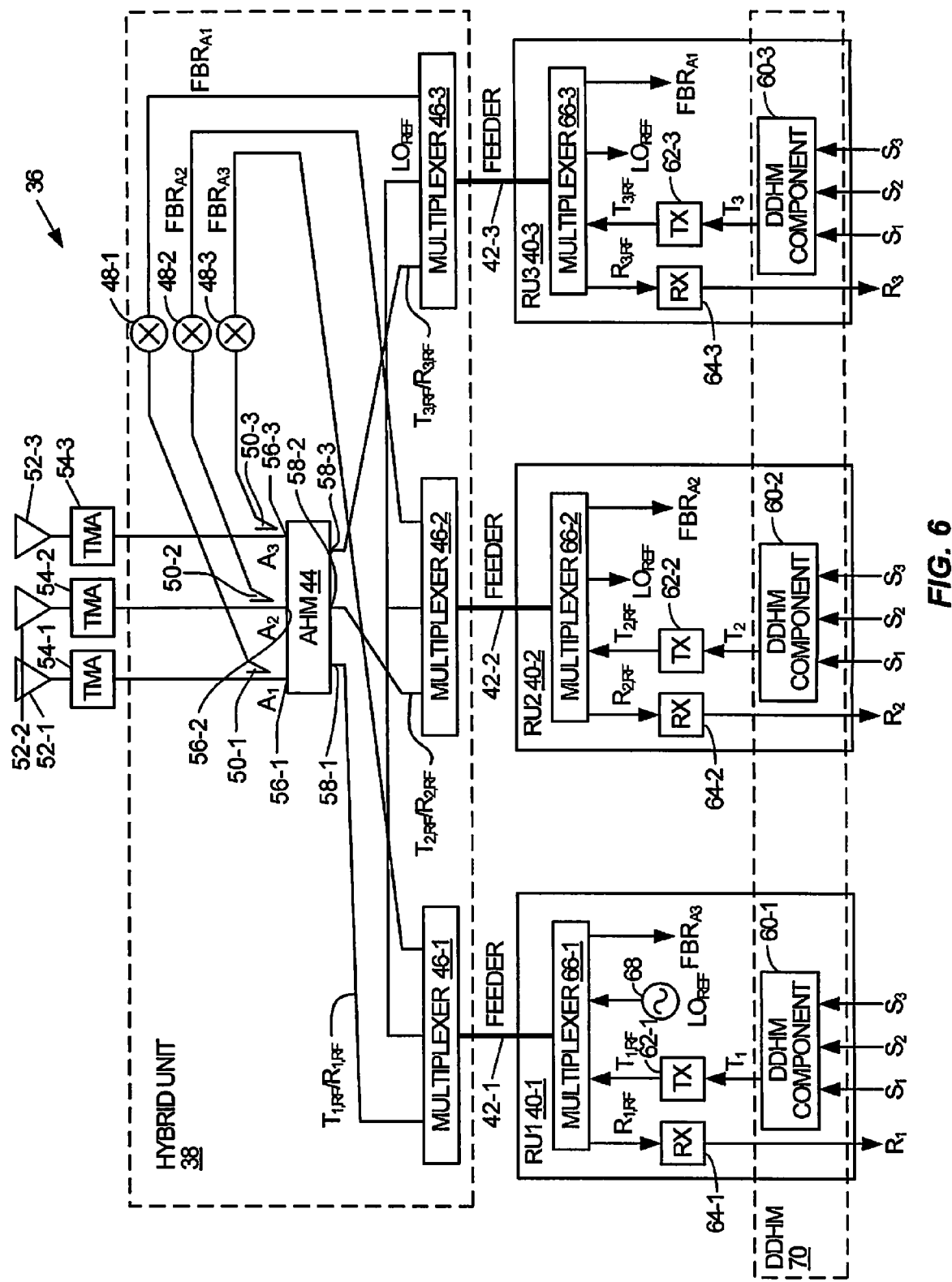
FIG. 6 illustrates the hybrid unit of FIG. 3 wherein all three of the DDCRUs are connected to the hybrid unit according to another embodiment of the present disclosure.

FIG. 6 illustrates the base station 36 of FIG. 3 in which all three of the radio units 40 are connected to the hybrid unit 38 according to another embodiment of the present disclosure. During operation, for the downlink from the base station 36, the DDHM components 60 receive the digital transmit signals ($S_1$ through $S_3$) and split and combine the digital transmit signals ($S_1$ through $S_3$) according to the desired transform function of the DDHM 70 to thereby generate the transformed transmit signals ($T_1$ through $T_3$). Each of the transformed transmit signals ($T_1$ through $T_3$) includes a component for each of the digital transmit signals ($S_1$ through $S_3$). More specifically, as discussed above, the DDHM component 60-1 weights the digital transmit signals ($S_1$ through $S_3$) according to the complex weights $W_{11}$, $W_{21}$, and $W_{31}$, respectively, and combines the resulting complex weighted digital transmit signals to provide the transformed transmit signal $T_1$. Likewise, the DDHM component 60-2 weights the digital transmit signals ($S_1$ through $S_3$) according to the complex weights $W_{12}$, $W_{22}$, and $W_{32}$, respectively, and combines the resulting complex weighted digital transmit signals to provide the transformed transmit signal $T_2$; and the DDHM component 60-3 weights the digital transmit signals ($S_1$ through $S_3$) according to the complex weights $W_{13}$, $W_{23}$, and $W_{33}$, respectively, and combines the resulting complex weighted digital transmit signals to provide the transformed transmit signal $T_3$.

The transmitters 62-1 through 62-3 upconvert and amplify the transformed transmit signals ($T_1$ through $T_3$), respectively, to thereby provide the radio frequency transformed transmit signals ($T_{1,RF}$ through $T_{3,RF}$). The multiplexer 66-1 multiplexes the radio frequency transformed transmit signal $T_{1,RF}$ onto the feeder cable 42-1 along with the transformed radio frequency receive signal $R_{1,RF}$, the reference local oscillator signal ($LO_{REF}$), and the feedback signal $FBR_{A3}$. Similarly, the multiplexer 66-2 multiplexes the radio frequency transformed transmit signal $T_{2,RF}$ onto the feeder cable 42-2 along with the transformed radio frequency receive signal $R_{2,RF}$, the reference local oscillator signal ($LO_{REF}$), and the feedback signal $FBR_{A2}$; and the multiplexer 66-3 multiplexes the radio frequency transformed transmit signal $T_{3,RF}$ onto the feeder cable 42-3 along with the transformed radio frequency receive signal $R_{3,RF}$, the reference local oscillator signal ($LO_{REF}$), and the feedback signal $FBR_{A1}$.

At the hybrid unit 38, the transformed transmit signals ($T_1$ through $T_3$) are provided to the feeder ports 58-1 through 58-3, respectively, via the multiplexers 46-1 through 46-3. The AHM 44 splits and combines the transformed transmit signals ($T_1$ through $T_3$) according to the desired transform function of the AHM 44 for the downlink to thereby generate the radio frequency transmit signals ($A_1$ through $A_3$) at the antenna ports 56-1 through 56-3, respectively. More specifically, in one particular embodiment, the AHM 44 has a transfer function for the downlink defined as:

$$A_1 = \frac{1}{\sqrt{3}}(T_{1,RF} + T_{2,RF}e^{j120°} + T_{3,RF}e^{j240°})$$

$$A_2 = \frac{1}{\sqrt{3}}(T_{1,RF} + T_{2,RF}e^{j0°} + T_{3,RF}e^{j0°})$$

$$A_3 = \frac{1}{\sqrt{3}}(T_{1,RF} + T_{2,RF}e^{-j120°} + T_{3,RF}e^{-j240°})$$

The DDHM 70 is configured such that, when the radio frequency transformed transmit signals ($T_{1,RF}$ through $T_{3,RF}$) are split and combined by the AHM 44, the components of the digital transmit signals $S_2$ and $S_3$ represented in the radio frequency transformed transmit signals ($T_{1,RF}$ through $T_{3,RF}$) are minimized or potentially eliminated in the radio frequency transmit signal $A_1$ generated at the antenna port 56-1, the components of the digital transmit signals $S_1$ and $S_3$ represented in the radio frequency transformed transmit signals ($T_{1,RF}$ through $T_{3,RF}$) are minimized or potentially eliminated in the radio frequency transmit signal $A_2$ generated at the antenna port 56-2, and the components of the digital transmit signals $S_1$ and $S_2$ represented in the radio frequency transformed transmit signals ($T_{1,RF}$ through $T_{3,RF}$) are minimized or potentially eliminated in the radio frequency transmit signal $A_3$ generated at the antenna port 56-3. In this manner, the radio frequency transmit signal $A_1$ is a radio frequency representation of the digital transmit signal $S_1$, the radio frequency transmit signal $A_2$ is a radio frequency representation of the digital transmit signal $S_2$, and radio frequency transmit signal $A_3$ is a radio frequency representation of the digital transmit signal $S_3$. The radio frequency transmit signals ($A_1$ through $A_3$) are then output to the antennas 52-1 through 52-3, respectively, via the TMAs 54-1 through 54-3. However, note that for the downlink, the TMAs 54-1 through 54-3 do not apply frequency shifts. Rather, the radio frequency transmit signals ($A_1$ through $A_3$) are passed to the corresponding antennas 52-1 through 52-3.

For the uplink to the base station 36, radio frequency receive signals are received at the antennas 52-1 through 52-3 and passed through the corresponding TMAs 54-1 through 54-3 to the antenna ports 56-1 through 56-3, respectively. In this embodiment, the TMAs 54-1 through 54-3 are configured to apply the same frequency shift, such as but not limited to a frequency shift of 0 degrees. The AHM 44 splits and combines the radio frequency receive signals from the TMAs 54-1 through 54-3, respectively, according to the desired transform function of the AHM 44 to thereby provide the transformed radio frequency receive signals ($R_{1,RF}$ through $R_{3,RF}$) at the feeder ports 58-1 through 58-3, respectively. As discussed above, each of the transformed radio frequency receive signals ($R_{1,RF}$ through $R_{3,RF}$) includes a component for each of the frequency-shifted radio frequency receive signals.

The multiplexer 46-1 multiplexes the transformed radio frequency receive signal $R_{1,RF}$ onto the feeder cable 42-1 along with the radio frequency transformed transmit signal $T_{1,RF}$, the reference local oscillator signal ($LO_{REF}$), and the feedback signal $FBR_{A3}$. At the radio unit 40-1, the multiplexer 66-1 provides the transformed radio frequency receive signal $R_{1,RF}$ to the receiver 64-1, which downconverts the transformed radio frequency receive signal $R_{1,RF}$ to baseband or a desired intermediate frequency to thereby provide a receive signal $R_1$. Likewise, the multiplexer 46-2 multiplexes the transformed radio frequency receive signal $R_{2,RF}$ onto the feeder cable 42-2 along with the radio frequency transformed transmit signal $T_{2,RF}$, the reference local oscillator signal ($LO_{REF}$), and the feedback signal $FBR_{A2}$. At the radio unit

40-2, the multiplexer 66-2 provides the transformed radio frequency receive signal $R_{2,RF}$ to the receiver 64-2, which downconverts the transformed radio frequency receive signal $R_{2,RF}$ to baseband or a desired intermediate frequency to thereby provide a receive signal $R_2$. Lastly, the multiplexer 46-3 multiplexes the transformed radio frequency receive signal $R_{3,RF}$ onto the feeder cable 42-3 along with the radio frequency transformed transmit signal $T_{3,RF}$, the reference local oscillator signal ($LO_{REF}$), and the feedback signal $FBR_{A1}$. At the radio unit 40-3, the multiplexer 66-3 provides the transformed radio frequency receive signal $R_{3,RF}$ to the receiver 64-3, which downconverts the transformed radio frequency receive signal $R_{3,RF}$ to baseband or a desired intermediate frequency to thereby provide a receive signal $R_3$. The modem 80 (FIG. 4) then performs an inverse AHM function as part of normal demodulation processing to recover the baseband representations of the radio frequency receive signals from the downconverted transformed radio frequency receive signals from the receivers 64-1 through 64-3.

Figure 7:
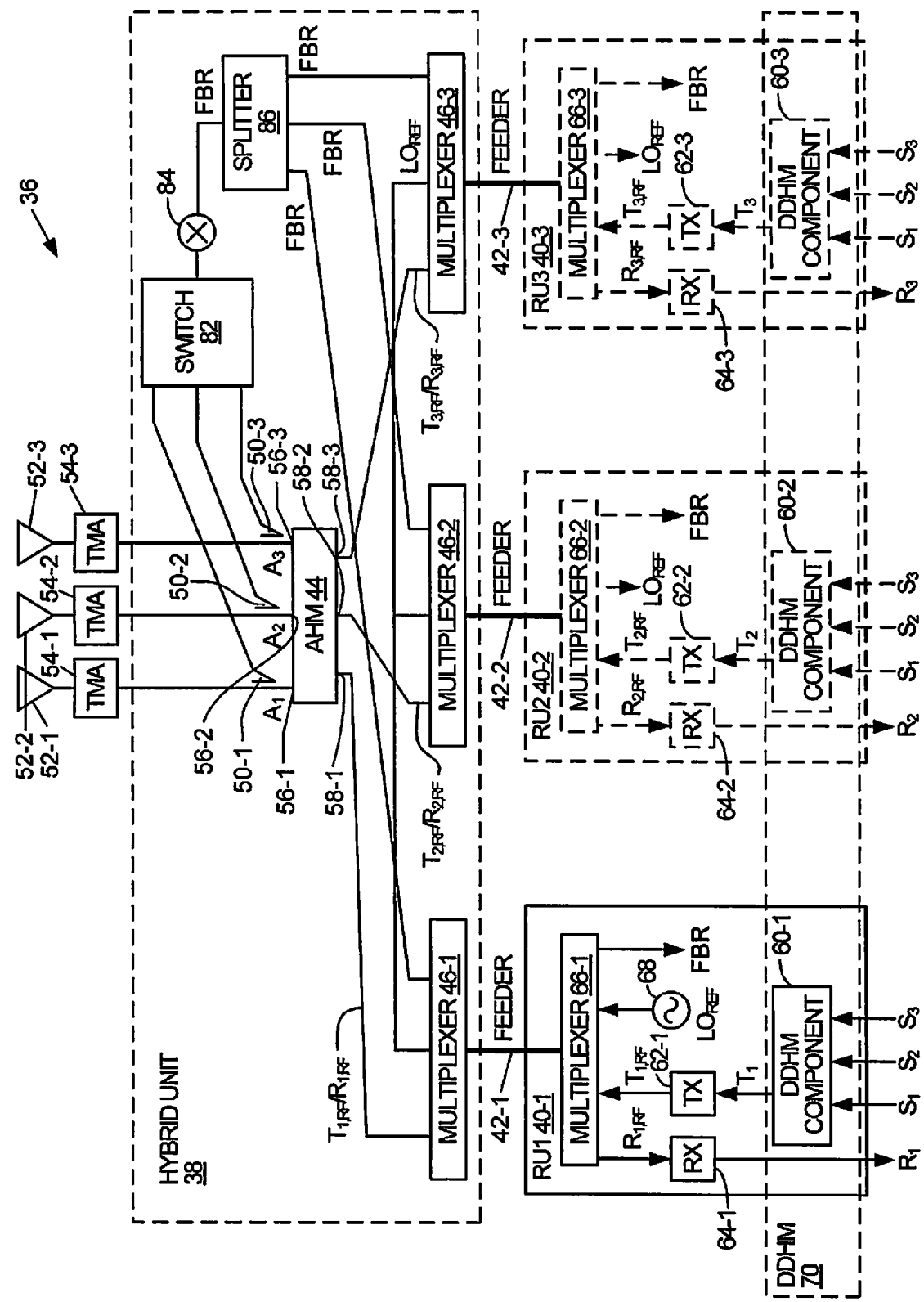
FIG. 7 illustrates a hybrid unit and a reconfigurable number of DDCRUs for a base station in a cellular communications network according to another embodiment of the present disclosure.

FIG. 7 illustrates an embodiment of the base station 36 that is substantially the same as that of FIG. 3 but where a feedback signal (FBR) for any one of the radio frequency transmit signals ($A_1$ through $A_3$) can be provided to any of the radio units 40. More specifically, in this embodiment, the hybrid unit 38 includes a switch 82, a mixer 84, and a splitter 86 connected as shown. The switch 82 is controlled such that a select one of the radio frequency transmit signals ($A_1$, $A_2$, or $A_3$) is provided to the mixer 84 for downconversion to a desired frequency using an appropriate local oscillator signal (not shown) and then provided to all of the radio units 40 via the multiplexers 46-1 through 46-3.

Figure 8:
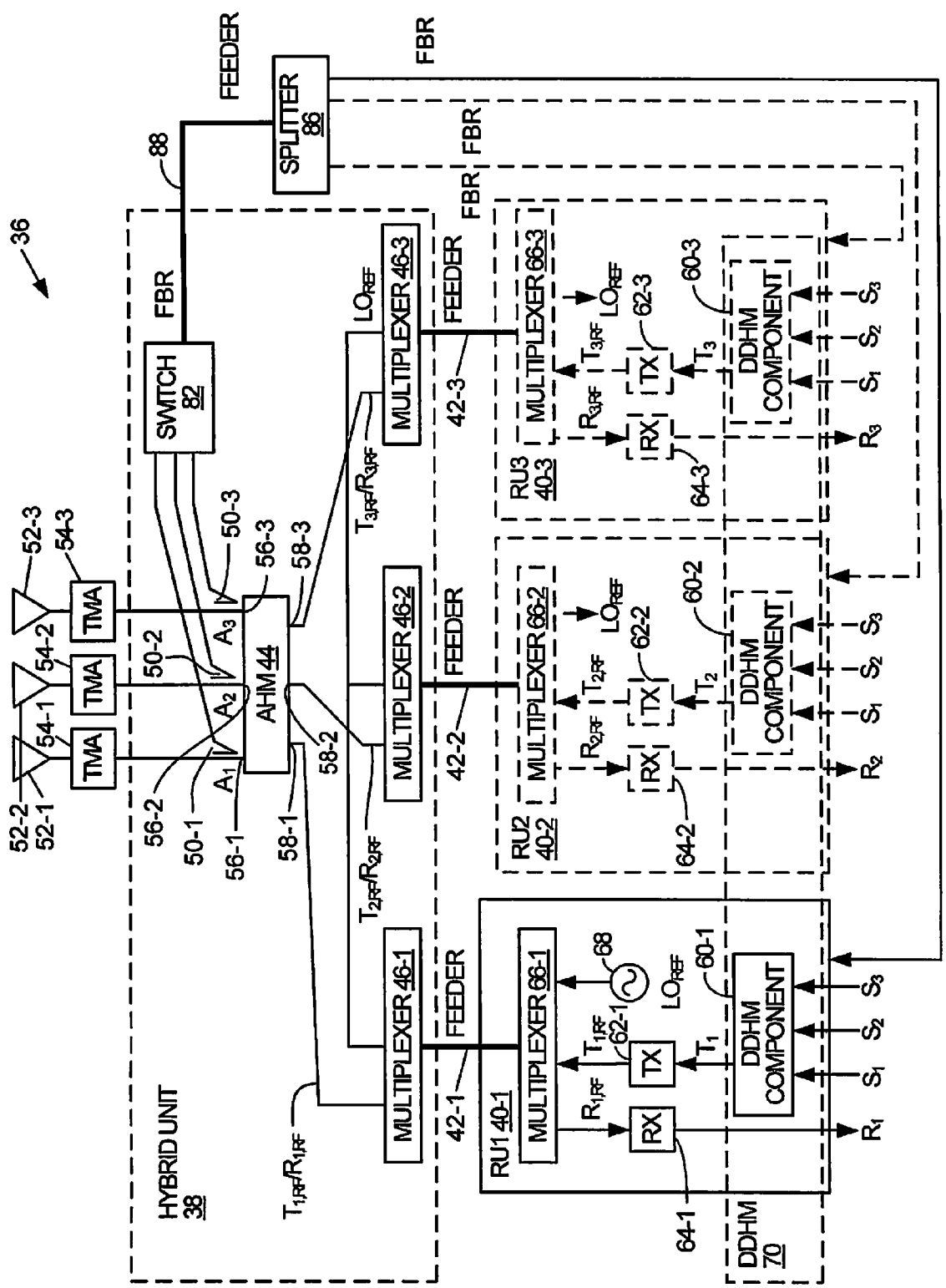
FIG. 8 illustrates a hybrid unit and a reconfigurable number of DDCRUs for a base station in a cellular communications network according to another embodiment of the present disclosure.

FIG. 8 illustrates an embodiment of the base station 36 that is substantially the same as that of FIG. 7 but where the feedback signal (FBR) from the switch 82 is communicated to the radio units 40 via a separate feeder cable 88. In this embodiment, the splitter 86 is associated with the radio units 40 rather than part of the hybrid unit 38. The FBR is split by the splitter 86 and provided to the radio units 40 via any suitable connection.

Figure 9:
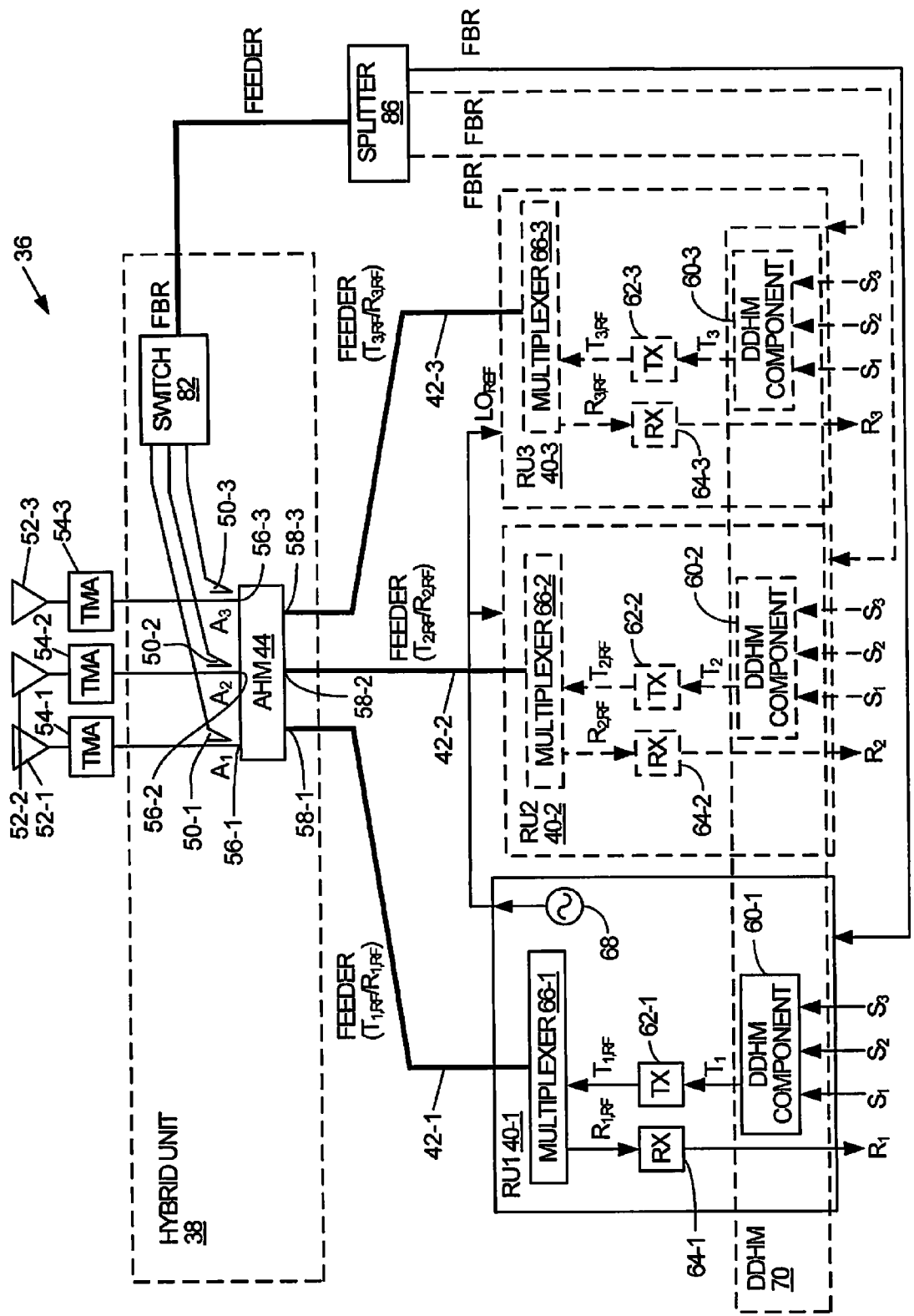
FIG. 9 illustrates a hybrid unit and a reconfigurable number of DDCRUs for a base station in a cellular communications network according to another embodiment of the present disclosure.

FIG. 9 illustrates an embodiment of the base station 36 that is substantially the same as that of FIG. 8 but where the reference local oscillator signal ($LO_{REF}$) is communicated between the radio units 40 via a separate connection rather multiplexed onto the feeder cables 42-1 through 42-3.

The following acronyms are used throughout this disclosure.
AHM Analog Hybrid Matrix
BTS Base Station Transceiver Set
DCR Digitally Convertible Radio
DDCR Distributed Digital Convertible Radio
DDCRU Distributed Digital Convertible Radio Unit
DDHM Distributed Digital Hybrid Matrix
DHM Digital Hybrid Matrix
TMA Tower Mounted Amplifier Those skilled in the art will recognize improvements and modifications to the preferred embodiments of the present disclosure. All such improvements and modifications are considered within the scope of the concepts disclosed herein and the claims that follow.

What is claimed is:

1. A hybrid unit for a base station in a cellular communications network, comprising:
an analog hybrid matrix comprising:
a plurality of feeder ports operative to connect to at least one radio unit and up to a plurality of radio units that are external to and separate from the hybrid unit; and
a plurality of antenna ports operative to connect to a plurality of antennas of the base station via a corresponding plurality of tower mounted amplifier units
wherein the analog hybrid matrix is further operative to:
receive a plurality of radio frequency receive signals from the plurality of tower mounted amplifier units at the plurality of antenna ports where each of the plurality of radio frequency receive signals is at a different carrier frequency due to different frequency shifts applied by the plurality of tower mounted amplifier units; and
generate a plurality of transformed radio frequency receive signals at the plurality of feeder ports such that one of the plurality of transformed radio frequency receive signals is output to a radio unit via one of the plurality of feeder ports, wherein each of the plurality of transformed radio frequency receive signals comprises a component for each of the plurality of radio frequency receive signals.

2. The hybrid unit of claim 1 wherein a number of radio units connected to the plurality of feeder ports of the analog hybrid matrix is reconfigurable.

3. The hybrid unit of claim 2 wherein there is no active reconfiguration of the hybrid unit in response to reconfiguring the number of radio units connected to the plurality of feeder ports of the analog hybrid matrix.

4. The hybrid unit of claim 1 wherein the one of the plurality of feeder ports is connected to the radio unit via a corresponding feeder cable.

5. The hybrid unit of claim 4 wherein the analog hybrid matrix is operative to:
receive an amplified radio frequency transmit signal from the radio unit at the one of the plurality of feeder ports via the feeder cable; and
split the amplified radio frequency transmit signal to thereby generate a plurality of amplified radio frequency transmit signals at the plurality of antenna ports.

6. The hybrid unit of claim 1 wherein the plurality of feeder ports is a number, N, of feeder ports, the plurality of antenna ports is a number, N, of radio ports, and each of the plurality of radio units includes one or more transceivers such that a total number of transceivers among the plurality of radio units is equal to N, wherein N is an integer greater than one.

7. A hybrid unit for a base station in a cellular communications network, comprising:
an analog hybrid matrix comprising:
a plurality of feeder ports operative to connect to at least one radio unit and up to a plurality of radio units that are external to and separate from the hybrid unit; and
a plurality of antenna ports operative to connect to a plurality of antennas of the base station via a corresponding plurality of tower mounted amplifier units
wherein the analog hybrid matrix is further operative to:
receive a plurality of radio frequency receive signals from the plurality of tower mounted amplifier units at the plurality of antenna ports where each of the plurality of radio frequency receive signals is at a different carrier frequency due to different frequency shifts applied by the plurality of tower mounted amplifier units; and
generate a plurality of transformed radio frequency receive signals at the plurality of feeder ports such that a different one of the plurality of transformed radio frequency receive signals is output to each of a different transceiver circuit of a plurality of radio units via a corresponding one of the plurality of feeder ports, wherein each of the plurality of transformed radio frequency receive signals comprises a component for each of the plurality of radio frequency receive signals.

8. The hybrid unit of claim 7 wherein the plurality of feeder ports are connected to the plurality of radio units such that each of the plurality of feeder ports is connected to the different transceiver circuit of the plurality of radio units via a corresponding feeder cable.

9. The hybrid unit of claim 8 wherein the analog hybrid matrix is operative to:
receive a plurality of transformed radio frequency transmit signals from the transceiver circuits of the plurality of radio units at the plurality of feeder ports, each transformed radio frequency transmit signal of the plurality of transformed radio frequency transmit signals comprising a component for each of a plurality of radio frequency transmit signals to be transmitted via the plurality of antennas; and
split and combine the plurality of transformed radio frequency transmit signals to generate the plurality of radio frequency transmit signals at the plurality of antenna ports.

10. The hybrid unit of claim 7 wherein a number of radio units connected to the plurality of feeder ports of the analog hybrid matrix is reconfigurable.

11. A radio unit for a base station in a cellular communications network comprising:
a feeder port operative to couple the radio unit to a hybrid unit that is external to and separate from the radio unit via a feeder cable;
a distributed digital hybrid matrix component operative to transform a plurality of digital transmit signals into a transformed transmit signal comprising a component for each of the plurality of digital transmit signals; and
a transmitter operative to upconvert and amplify the transformed transmit signal to provide a transformed radio frequency transmit signal to be output to the hybrid unit via the feeder port.

12. The radio unit of claim 11 wherein the distributed digital hybrid matrix component of the radio unit and one or more additional distributed digital hybrid matrix components of one or more additional radio units of the base station connected to the hybrid unit form a distributed digital hybrid matrix that converts the plurality of digital transmit signals into a plurality of transformed transmit signals each comprising a component for each of the plurality of digital transmit signals.

13. The radio unit of claim 12 wherein the radio unit comprises one or more components operative to adaptively configure the distributed digital hybrid matrix component of the base station and the one or more additional distributed digital hybrid matrix components of the one or more additional radio units.

14. The radio unit of claim 13 wherein:
the hybrid unit comprises an analog hybrid matrix operative to transform a plurality of transformed radio frequency transmit signals that correspond to the plurality of transformed transmit signals generated by the distributed digital hybrid matrix component of the base station and the one or more additional distributed digital hybrid matrix components of the one or more additional radio units to provide a plurality of radio frequency transmit signals each representing a corresponding one of the plurality of digital transmit signals; and
the one or more components are operative to adaptively configure the distributed digital hybrid matrix component of the base station and the one or more additional distributed digital hybrid matrix components of the one or more additional radio units such that, for each radio frequency transmit signal of the plurality of radio frequency transmit signals, components of the plurality of digital transmit signals other than the corresponding one of the plurality of digital transmit signals are minimized in the radio frequency transmit signal.

15. The radio unit of claim 12 wherein the radio unit and the one or more additional radio units are phase-locked.

16. The radio unit of claim 15 wherein the transformed radio frequency transmit signal, a transformed radio frequency receive signal from the hybrid unit, a reference local oscillator signal, and a feedback signal from the hybrid unit used in adaptive configuration of the distributed digital hybrid matrix component and the one or more additional distributed digital hybrid matrix components are multiplexed onto the feeder cable.

17. The radio unit of claim 15 wherein the transformed radio frequency transmit signal, a transformed radio frequency receive signal from the hybrid unit, and a reference local oscillator signal are multiplexed onto the feeder cable.

18. The radio unit of claim 17 wherein the radio unit receives a feedback signal from the hybrid unit used in adaptive configuration of the distributed digital hybrid matrix component and the one or more additional distributed digital hybrid matrix components via a separate feeder cable.

19. The hybrid unit of claim 15 wherein the transformed radio frequency transmit signal and a transformed radio frequency receive signal from the hybrid unit are multiplexed onto the feeder cable, and the radio unit receives a reference local oscillator signal via a separate connection.

20. The radio unit of claim 19 wherein the radio unit receives a feedback signal from the hybrid unit used in adaptive configuration of the distributed digital hybrid matrix component via a separate feeder cable.

21. The hybrid unit of claim 15 wherein the transformed radio frequency transmit signal and a transformed radio frequency receive signal from the hybrid unit are multiplexed onto the feeder cable, and the radio unit provides a reference local oscillator signal to the one or more additional radio units via a separate connection.

22. The radio unit of claim 21 wherein the radio unit receives a feedback signal from the hybrid unit used in adaptive configuration of the distributed digital hybrid matrix component via a separate feeder cable.

* * * * *